(12) United States Patent
Yim et al.

(10) Patent No.: US 7,836,291 B2
(45) Date of Patent: Nov. 16, 2010

(54) METHOD, MEDIUM, AND APPARATUS WITH INTERRUPT HANDLING IN A RECONFIGURABLE ARRAY

(75) Inventors: Keun Soo Yim, Yongin-si (KR); Jeong Wook Kim, Seognam-si (KR); Soo Jung Ryu, Cheonam-si (KR); Jung Keun Park, Seoul (KR); Jeong Joon Yoo, Yongin-si (KR); Dong-Hoon Yoo, Suwon-si (KR); Chae Seok Im, Seoul (KR); Jae Don Lee, Paju-si (KR); Hee Seok Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 347 days.

(21) Appl. No.: 11/581,366

(22) Filed: Oct. 17, 2006

(65) Prior Publication Data

US 2007/0186085 A1 Aug. 9, 2007

(30) Foreign Application Priority Data

Feb. 6, 2006 (KR) ...................... 10-2006-0011200

(51) Int. Cl.
*G06F 9/00* (2006.01)
*G06F 13/24* (2006.01)
(52) U.S. Cl. ...................................... 712/244; 710/262
(58) Field of Classification Search ........................ None
See application file for complete search history.

(56) References Cited

U.S. PATENT DOCUMENTS

| | | | |
|---|---|---|---|
| 6,058,469 A | 5/2000 | Baxter | |
| 6,247,110 B1 | 6/2001 | Huppenthal et al. | |
| 6,606,676 B1 * | 8/2003 | Deshpande et al. | 710/262 |
| 6,799,265 B1 * | 9/2004 | Dakhil | 712/217 |
| 6,839,828 B2 * | 1/2005 | Gschwind et al. | 712/20 |
| 7,167,976 B2 * | 1/2007 | Poznanovic | 713/1 |
| 7,222,203 B2 * | 5/2007 | Madukkarumukumana et al. | 710/260 |
| 7,487,339 B2 * | 2/2009 | Uhler | 712/228 |

FOREIGN PATENT DOCUMENTS

| | | |
|---|---|---|
| JP | 5-113887 | 5/1993 |
| JP | 8-297581 | 11/1996 |

(Continued)

OTHER PUBLICATIONS

KIPO Notice of Primary Rejection for corresponding Korean Application No. 046435689 issued Aug. 28, 2007.
KIPO Notice of Primary Rejection for corresponding Korean Application No. 046435689 issued Mar. 23, 2007.

*Primary Examiner*—Jacob Petranek
(74) *Attorney, Agent, or Firm*—Staas & Halsey LLP

(57) ABSTRACT

A method, medium, and apparatus to effectively handle an interrupt in a reconfigurable array. In the method, the reconfigurable array pauses execution of an operation when an interrupt request occurs, and after storing register values of a register to be used for handling the interrupt request, an interrupt service is performed by select processing units of the reconfigurable array in response to the interrupt request. Upon completion of the interrupt service, the register values are restored, and the reconfigurable array resumes execution of the operation.

17 Claims, 10 Drawing Sheets

FOREIGN PATENT DOCUMENTS

| | | |
|---|---|---|
| KR | 1994-0007828 | 8/1994 |
| KR | 1998-025435 | 7/1998 |
| KR | 1998-035186 | 8/1998 |
| KR | 1999-017724 | 3/1999 |
| KR | 1999-0033051 | 5/1999 |
| KR | 10-2002-0035603 | 5/2002 |
| KR | 2003-0077696 | 10/2003 |

* cited by examiner

METHOD, MEDIUM, AND APPARATUS WITH INTERRUPT HANDLING IN A RECONFIGURABLE ARRAY

CROSS-REFERENCE TO RELATED APPLICATIONS

This application claims priority from Korean Patent Application No. 10-2006-0011200, filed on Feb. 6, 2006, in the Korean Intellectual Property Office, the entire disclosure of which is incorporated herein by reference.

BACKGROUND OF THE INVENTION

1. Field of the Invention

An embodiment of the present invention relates generally to a reconfigurable architecture and, more particularly, to a method, medium, and apparatus that effectively handles an interrupt that occurs during an execution of a task in a reconfigurable array.

2. Description of the Related Art

Traditionally, devices for performing differing operations have been embodied by either fixed hardware or reconfigurable software. For example, when a network controller performing a network interface is embodied/implemented through a computer chip, the network controller is able to perform only the network interface operation defined during the factory fabrication of the computer chip. After the network controller has been fabricated in the factory, changing the desired operation of the network controller is not possible. This is, thus, an example of hardware. Conversely, as a software implementation, for example, a program for implementing a desired operation may be programmed, e.g., for implementation by a general purpose processor. Here, with software, new operations may be performed merely by changing the post-fabrication software. When software is used, various operations may be performed by a given hardware device, but these software implementations have drawbacks in their performing of the desired operations with lower speeds than when only hardware is used.

Thus, to appease the need for speed, and to overcome such hardware drawback, reconfigurable hardware architectures have been designed. These reconfigurable architecture devices can be customized to solve any problem through a hardware implementation, after device fabrication, while still exploiting a large degree of spatially customized computations in order to perform their desired operations.

FIG. 1 illustrates a field programmable gate array (FPGA) as an example of a conventional reconfigurable architecture device. As illustrated in FIG. 1, the FPGA includes a plurality of arithmetic and logic units (ALUs) 101, 102, 103, 104, and 105 and a plurality of lines 106 connecting the plurality of ALUs. The FPGA is customized, during manufacture, to perform some computation, e.g., to compute "A*x*x+B*X+C". Here, if the operation of "A*x*x+B*X+C" occurs frequently, the FPGA is manufactured in a manner to perform the operation, thereby more quickly performing the same operation than software implemented techniques. After manufacture, the configuration within the FPGA may be changed by applying a current to the lines 106 of the ALUs and designating the ALUs and corresponding interconnections to perform a new operation, e.g., the configuration for computing this alternate operation can be newly formed using plurality of lines 106. As described above, this reconfigurable architecture is architecture capable of performing a new operation by changing the hardware configuration after fabrication.

In FIG. 1, data is input to an ALU one bit at a time. This kind of reconfigurable architecture is called a fine grained array. If data is input to a processing element in units of one word at a time, the reconfigurable architecture is called a coarse grained array (CGA).

FIG. 2 illustrates a tightly-coupled coarse grained array architecture.

The coarse grained array 210 may include a plurality of processing elements 211, with each of the plurality of processing elements 211 including an operation unit 212 and a register file 213. The operation unit 212 performs computations, and the register file 213 is a group of registers for temporarily storing data used by the operation unit 212. In the illustrated coarse grained array, and in embodiments of the present invention, the illustrated operation units are illustrated as "FU" representing a "function unit," i.e., a particular function performing unit. These units have been referred herein as "operation" units, as these units are not meant to be limiting to any particular operation or device described solely herein, i.e., alternative embodiments not described herein for such operation units are equally available.

A configuration memory 220 may further be included for storing information associated with the configuration of the coarse grained array 210. According to the configuration stored in the configuration memory 220, the coarse grained array 210 changes the connection state between processing elements included in the coarse grained array 210. Further, in this conventional architecture, a data memory 230 is located outside the coarse grained array 210 and stores data.

Such reconfigurable arrays, including this coarse grained array 210, may be implemented with cooperation with the CPU of a computing apparatus. Similarly, the reconfigurable array may be used as a coprocessor, an attached processing unit, or a stand-alone processing unit, for example.

In such reconfigurable arrays, when an interrupt occurs, such as a request for an immediate operation to be commenced, during a loop calculation in the reconfigurable array, there often arises an issue of how to handle the interrupt. The interrupt may further include a hardware interrupt, such as an external I/O unit or a timer, an exception such as undefined instruction, and a software interrupt such as a system call. Typically, when an interrupt request occurs in a general computer architecture, a current context including currently stored values are stored in a memory, processing according to the interrupt is performed, the context stored in the memory is then restored, and the original operations are restarted. Namely, if an interrupt request occurs, a context switching may be required. The "context" represents a current state and condition of a system and may include values stored in a register.

However, using the above FIG. 2 example again, since the coarse grained array includes so many register files, the amount of memory overhead becomes very large. Namely, it takes a relatively long time to store all the values stored in the many register files to a memory. Further, the overall design becomes very complex to provide the line connecting each of the register files to a data memory. As described above, conventional systems to not provide any solutions for the considerable overhead occurring in the coarse grained array when implementing the interrupt requiring the context switch. Particularly, such considerations become even more critical when the process to be performed by an interrupt has a particular constraint, such as having to perform the interrupt operation in real-time.

Accordingly, there is a desire for a technique to efficiently process an interrupt occurring in a processor having a coarse grained array.

SUMMARY OF THE INVENTION

An aspect of an embodiment of the present invention is to provide a method, medium, and apparatus that can effectively handle an interrupt that may occur in a computing apparatus including a reconfigurable array.

Another aspect of an embodiment of the present invention is to execute an interrupt handling while minimizing overhead and also satisfying real-time constraints when an interrupt request occurs during the execution of a task in a reconfigurable array.

Still another aspect of an embodiment of the present invention is to prevent starvation from occurring while handling an interrupt request that occurs during the execution of a task in a reconfigurable array.

A still further aspect of an embodiment of the present invention is to provide a method, medium, and apparatus that minimizes context storing and also satisfies real-time constraints when an interrupt request occurs during the execution of a task in a reconfigurable array.

Additional aspects and/or advantages of the invention will be set forth in part in the description which follows and, in part, will be apparent from the description, or may be learned by practice of the invention.

To achieve the above and/or other aspects and advantages, embodiments of the present invention include a reconfigurable array control method, the method including suspending an operation in a reconfigurable array when an interrupt request occurs during execution of the operation by the reconfigurable array, storing register values of at least one register for select processing units of the reconfigurable array to be used for handling the interrupt request, executing an interrupt service with the select processing units in response to the interrupt request, and resuming the operation in the reconfigurable array after restoring the register values to the at least one register.

The suspending of the operation may include stopping a clock of the reconfigurable array, and wherein the resuming of the operation includes resuming the clock of the reconfigurable array.

Further, the storing of the register values may include pushing the register values into a predetermined stack, and wherein the restoring of the register values includes popping the register values from the stack.

To achieve the above and/or other aspects and advantages, embodiments of the present invention include a reconfigurable array control method, the method including suspending an operation in a reconfigurable array when an interrupt request occurs during execution of the operation by the reconfigurable array, executing an interrupt service with select processing units in response to the interrupt request by using a dedicated register for the interrupt service, and resuming the operation in the reconfigurable array after completing the interrupt service in the select processing units.

The suspending of the operation may include stopping a clock of the reconfigurable array, and the resuming of the operation may include resuming the clock of the reconfigurable array.

To achieve the above and/or other aspects and advantages, embodiments of the present invention include a reconfigurable array control method, the method including computing a programmed threshold time with regard to an operation to be executed in a reconfigurable array, comparing a current cycle time of the operation with the programmed threshold time when an interrupt request occurs during the execution of the operation by the reconfigurable array, and discarding the interrupt request when the current cycle time is greater than the programmed threshold time.

The programmed threshold time may be a time limit within which an interrupt service should start in response to the interrupt request.

In addition, the programmed threshold time may be a starting cycle time plus a worst case execution time minus a maximum interrupt latency for the operation, wherein the starting cycle time is a time taken to start the operation in the reconfigurable array, the worst case execution time is a time interval indicating when the operation is expected to terminate even in a worst case of the operation execution by the reconfigurable array, and the maximum interrupt latency is a maximum time allowable to postpone a start of the interrupt service, in response to the interrupt request, after receipt of the interrupt request.

The method may further include suspending an operation in the reconfigurable array when the current cycle time is less than the programmed threshold time, executing an interrupt service in the reconfigurable array in response to the interrupt request after storing register values of at least one register for select processing units of the reconfigurable array to be used for handling the interrupt request, and resuming the operation in the reconfigurable array after completing the interrupt service in the select processing units.

To achieve the above and/or other aspects and advantages, embodiments of the present invention include a reconfigurable array control method, the method including comparing a worst case execution time of an operation executed by a reconfigurable array with a maximum interrupt latency of an interrupt request when the interrupt request occurs during the execution of a operation by the reconfigurable array, and executing an interrupt service, in response to the interrupt request, by select processing units of the reconfigurable array upon the operation ending in the reconfigurable array, when the worst case execution time is not greater than the maximum interrupt latency.

The method may further include comparing a current cycle time of the operation with a programmed threshold time, and discarding the interrupt request when the current cycle time is greater than the programmed threshold time.

Here, the programmed threshold time may be a starting cycle time plus a worst case execution time minus a maximum interrupt latency for the operation, wherein the starting cycle time is a time to start the operation in the reconfigurable array, the worst case execution time is a time interval indicating when the operation is expected to terminate even in a worst case of the operation execution in the reconfigurable array, and the maximum interrupt latency is a maximum time allowable to postpone a start of the interrupt service, in response to the interrupt request, after receipt of the interrupt request.

The method may further include suspending an operation in the reconfigurable array when the current cycle time is less than the programmed threshold time, executing the interrupt service in the reconfigurable array in response to the interrupt request after storing register values of at least one register for select processing units of the reconfigurable array to be used for handling the interrupt request, and resuming the operation in the reconfigurable array after completing the interrupt service in the select processing units.

To achieve the above and/or other aspects and advantages, embodiments of the present invention include a reconfigurable array control method, the method including executing an interrupt service in select processing units of a reconfigurable array in response to an interrupt request when the interrupt request occurs during an execution of an operation by the reconfigurable array in a reconfigurable array mode, storing a context for an instruction set processor mode before converting the instruction set processor mode into the reconfigurable array mode, with the instruction set processor mode including select processing units, of the reconfigurable array, used in the instruction set processor mode that are also used in the reconfigurable array mode, and restoring the context for the instruction set processor mode after completion of the interrupt service by the select processing units.

The method may further include executing the operation in the reconfigurable array, after the restoring of the context for the instruction set processor mode, from a beginning of the operation in the reconfigurable array.

In addition, the interrupt service may be executed by the select processing units in the instruction set processor mode.

To achieve the above and/or other aspects and advantages, embodiments of the present invention include at least one medium including a reconfigurable array unit and a controller unit, the controller unit handling an interrupt according to embodiments of the present invention.

To achieve the above and/or other aspects and advantages, embodiments of the present invention include a computing apparatus, including a reconfigurable array including a plurality of processing units, and an interrupt controller to store register values of at least one register for select processing units of the reconfigurable array to be used for handling an interrupt request, to execute an interrupt service by the select processing units in response to the interrupt request, and to restore the register values to the at least one register upon completion of the interrupt service by the select processing units, wherein the reconfigurable array selectively pauses execution of an operation being executed by the reconfigurable array upon receipt of the interrupt request, and selectively resumes executing the operation upon completion of the interrupt service.

The execution of the operation by the reconfigurable array may pause by stopping a clock of the reconfigurable array, and resume execution of the operation by resuming the clock of the reconfigurable array.

Further, the stopping of the clock may include stopping a clock input to the reconfigurable array and the resuming of the clock may include resuming a clock input to the reconfigurable array.

At least one of the select processing units may not have an include a matched reference file, while the plurality of processing units other than the select processing units includes a respective reference file matched to each processing unit.

To achieve the above and/or other aspects and advantages, embodiments of the present invention include a computing apparatus, including a reconfigurable array including a plurality of processing units, and a plurality of shadow registers each corresponding to one register selected among registers used in an instruction set processor mode, wherein the reconfigurable array selectively pauses execution of an operation being executed by the plurality of processing units of the reconfigurable array upon receipt of an interrupt request, executes an interrupt service using select processing units, of the plurality of processing units, in response to the interrupt by using the shadow registers, and resumes executing the operation upon completion of the interrupt service using the plurality of processing units.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
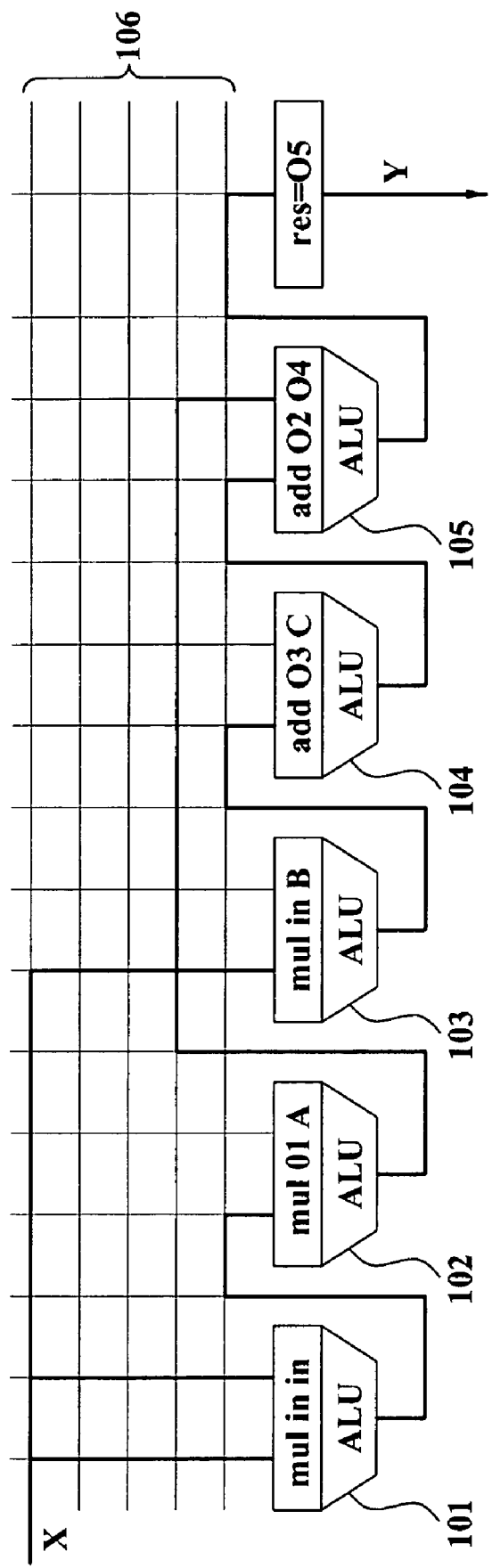
FIG. 1 illustrates a conventional reconfigurable architecture.
Figure 2:
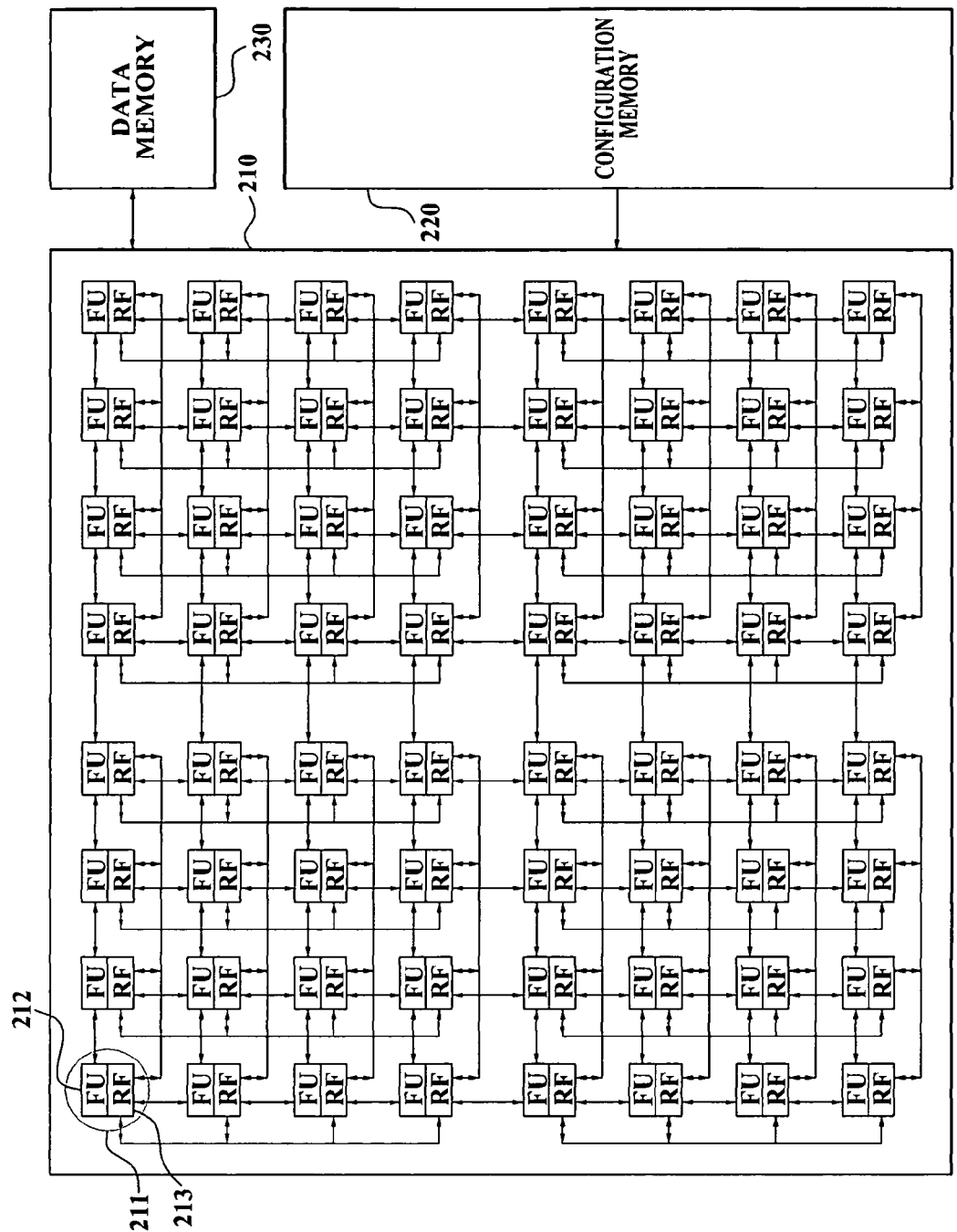
FIG. 2 illustrates a conventional coarse grained array.

Reference will now be made in detail to embodiments of the present invention, examples of which are illustrated in the accompanying drawings, wherein like reference numerals refer to the like elements throughout. Embodiments are described below in order to explain the present invention by referring to the figures.

In consideration of the above discussion regarding conventional reconfigurable arrays, when an interrupt occurs in a reconfigurable array, one possible way to handle the interrupt is to block the handling of the interrupt until a currently executed task of the reconfigurable array is finished. This technique does not discard the results of a computation task that the reconfigurable array has already executed. Therefore, this technique may use computing power more efficiently, but may fail to satisfy real-time constraints of a corresponding process to be handled by the interrupt request. Particularly, such a technique may result in user inconvenience when a task to be newly executed by an interrupt request is a real-time application such as a video playback.

Figure 3:
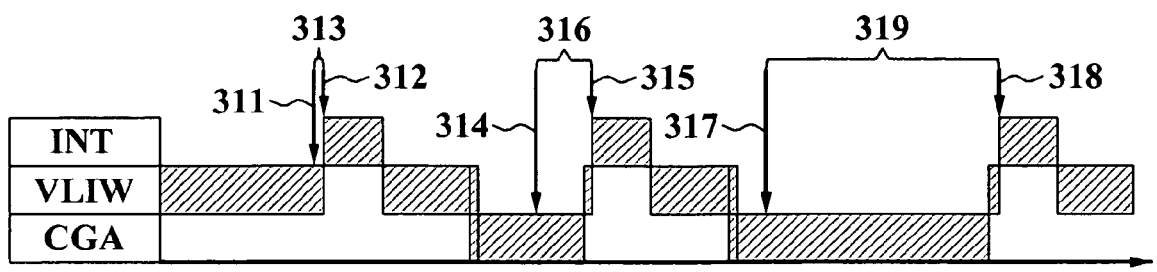
FIG. 3 illustrates a difficulty with interrupt handling in a reconfigurable architecture.

Referring to FIG. 3, reference numerals 311, 314 and 317 indicate a point where an interrupt request occurs, reference numerals 312, 315 and 318 indicate a point where a proper service starts in response to the interrupt request, and referential numerals 313, 316 and 319 indicate the time between the interrupt request and the start of the responsive service. When an interrupt request occurs in an instruction set processor mode at point 311, such an interrupt request is immediately handled. However, when an interrupt request occurs in a reconfigurable array mode at points 314 or 317, such an interrupt is blocked until a currently executing task is finished in the reconfigurable array. In particular, since the third interrupt request at point 317 needs a longer time to finish the corresponding task, real-time constraints of the interrupt request are not satisfied.

Figure 4:
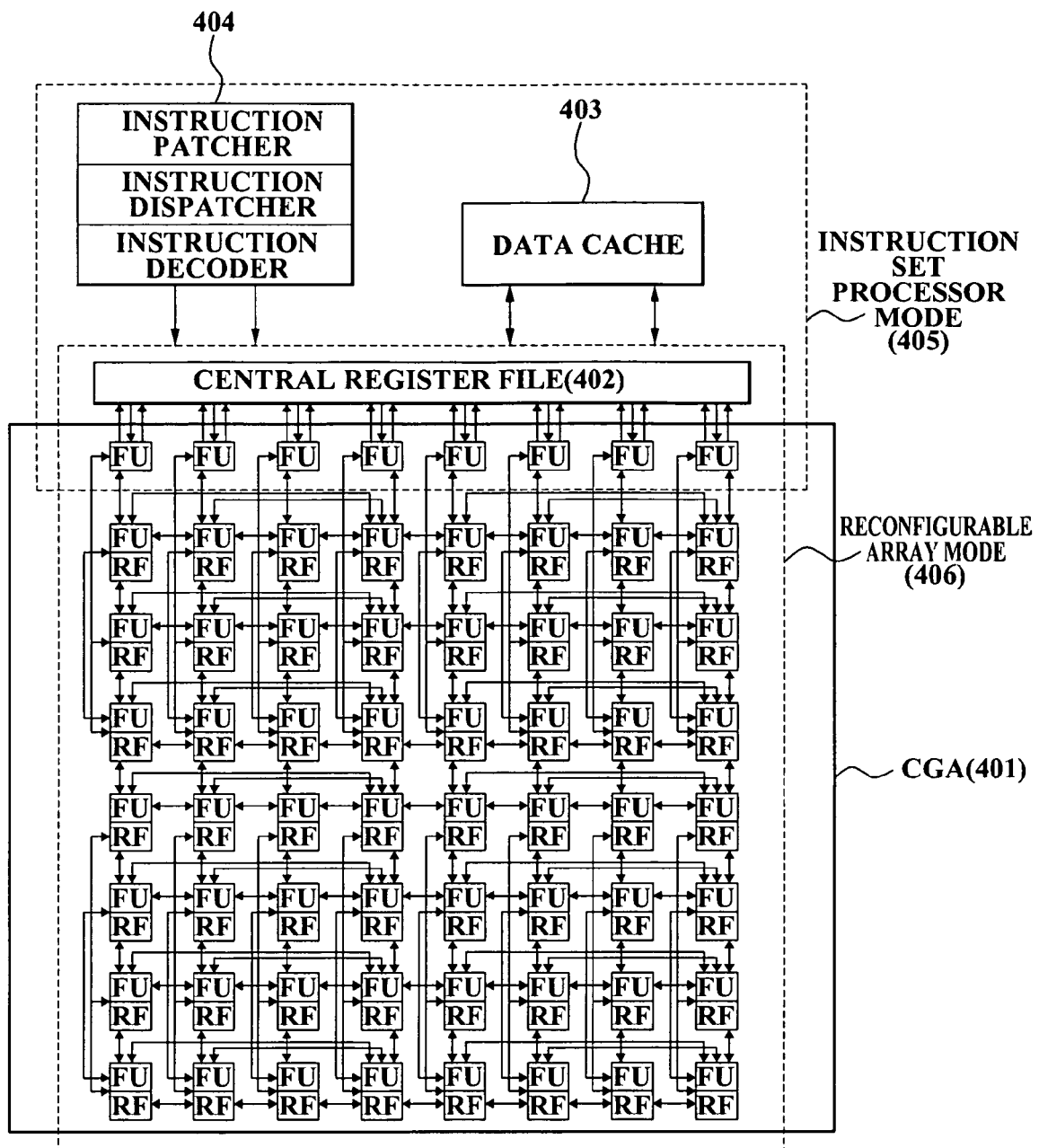
FIG. 4 illustrates an apparatus having a coarse grained array, according to an embodiment of the present invention.

FIG. 4 illustrates an apparatus with a coarse grained array, according to an embodiment of the present invention.

Referring to FIG. 4, a coarse grained array (CGA) 401 has a plurality of processing elements, with each processing element potentially only having only an operation unit or, alternatively, some processing units may also have a register file. In FIG. 4, a processing element, commonly belonging to both an instruction set processor mode 405 and a reconfigurable array mode 406, may not have a register file. Alternate processing elements of the reconfigurable array mode 406 may include both the register file and the operation unit. As noted above, the operation unit executes computations, whereas the register file, and a set of registers, temporarily stores data used in the operation unit.

The apparatus may further include a central register file 402 outside of the CGA 401 to store both results calculated by the CGA 401 and intermediate results of a host processor, for example. Similarly, a data cache 403 and instruction patcher/dispatcher/decoder 404 may be located outside of the CGA 401, with the data cache 403 and storing data, and the instruction patcher/dispatcher/decoder 404 patching, dispatching and decoding instructions, for example.

A processor using such a CGA 401 may include another host processor (not shown) together with the CGA 401 as a processing unit. In this case, normal instructions may be executed in the host processor, while other instructions, requiring repeated execution such as a loop, may be executed in the CGA. Such a configuration where the CGA and the host processor are divided may often be referred to as a loosely coupled configuration.

The computing apparatus shown in FIG. 4 may still further employ some processing elements of the CGA 401 as the host processor. In such a case, the host processor operations may be implemented by the eight processing elements of the instruction set processor mode 405. Here, normal instructions may be executed in some select processing elements, selected from the CGA 401, whereas other instructions, requiring repeated execution such as loop, may be executed by the entire CGA 401, for example, including the above processing elements. Such a configuration in which some processing elements of the CGA are used as the host processor may often be referred to as a tightly coupled configuration.

Here, the tightly coupled configuration has the reconfigurable array mode 406 and the instruction set processor mode 405, with the reconfigurable array mode 406 implementing the operation units of the CGA 401. Therefore, in the array mode 406, the processing elements act as parts of the CGA. Conversely, the instruction set processor mode 405 may operate only select operation units of the CGA 401. For example, in the processor mode 405, the selected processing elements may be active, while the other processing elements are inactive.

Since this tightly coupled configuration allows for some processing elements of the CGA to be used as the host processor, no additional host processor is needed. Therefore, a resultant corresponding processor has a reduced size and a lowered fabrication cost over conventional systems.

Furthermore, when some processing elements of the CGA 401 are used as the host processor, a very long instruction word (VLIW) architecture may also be used. In this case, the VLIW architecture may be made up of the instruction patcher/dispatcher/decoder 404, the central register file 402, the data cache 403, and some processing elements, for example.

Although several embodiments of the tightly coupled configuration using the CGA has been discussed herein, embodiments of the present invention may be favorably applied to other reconfigurable architectures as well as the loosely coupled configuration using the CGA, and should not be limited to only embodiments discussed herein.

Figure 5:
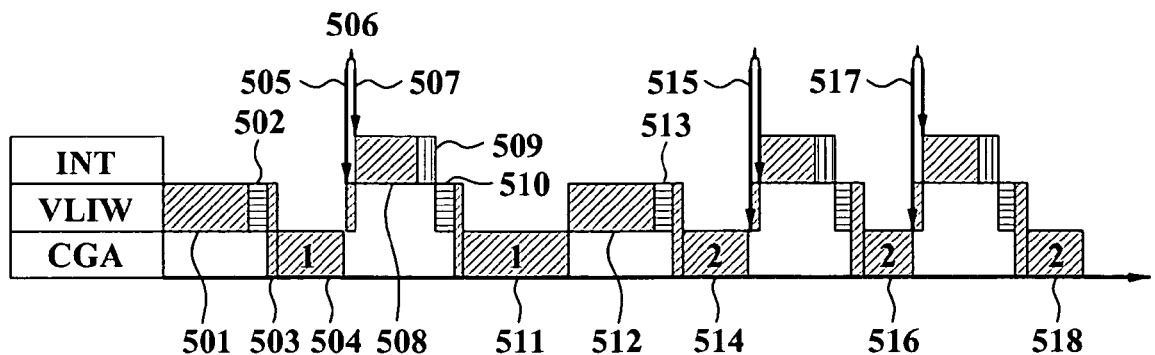
FIG. 5 illustrates an interrupt handling in a reconfigurable array, according to an embodiment of the present invention.

FIG. 5 illustrates an interrupt handling in a reconfigurable array, according to another embodiment of the present invention.

Here, the computing apparatus stores context in the instruction set processor mode before switching from the instruction set processor mode to the reconfigurable array mode. As shown in the previous FIG. 4, the reconfigurable array mode has a very large context due to the great number of register files, whereas the instruction set processor mode has a very small context due to the small number of register files. Therefore, storing the context of the instruction set processor mode uses very small overhead.

Referring to FIG. 5, in order to switch from the instruction set processor mode 501 to the reconfigurable array mode 504, in this embodiment, the computing apparatus stores the context of the instruction set processor mode at point 502. A referential number 503 represents the time required for some tasks related to this mode conversion.

When an interrupt request 505 takes place during the execution of a reconfigurable array task in the reconfigurable array mode 504, the computing apparatus starts an interrupt service at point 507 in response to the interrupt request 505 without blocking the interrupt request or without waiting until the reconfigurable array task has finished. The reference number 506 represents the time required for some tasks, such as pipeline flushing, related to the start of the interrupt service. This time is a negligible quantity in the whole computation time, and a normal computing apparatus may also need such time.

After the interrupt service has finished at point 508, the computing apparatus may restore the context of the instruction set processor mode at point 509, and again execute the reconfigurable array task at point 511. Since the interrupt service is carried out in the instruction set processor mode in such a tightly coupled configuration of the CGA, the computing apparatus stores the context of the instruction set processor mode at point 510 for switching to the reconfigurable array mode.

Because the context of the instruction set processor mode is stored during the switch from the instruction set processor mode to the reconfigurable array mode, it is possible to execute the reconfigurable array mode from the beginning by restoring the context even though an interrupt service is provided in response to an interrupt request in the reconfigurable array mode.

Accordingly, this embodiment may satisfy the real-time constraints of an interrupt request since an immediate service is provided in response to the interrupt request. However, here, an overhead may be needed to store the context whenever the instruction set processor mode switches to the reconfigurable array mode. Additionally, if an interrupt continually takes place at intervals smaller than a task execution time required in the reconfigurable array mode, there is a possibility of causing starvation.

This possibility of starvation will be described hereinafter with reference to FIG. 5. After the instruction set processor mode is executed at point 512 and the corresponding context is stored at point 513, the instruction set processor mode may switch to the reconfigurable array mode. Then a second task (2) may be executed in the reconfigurable array mode at point 514. Thereafter, when an interrupt takes place at point 515, such an interrupt is handled and the second task is executed again from the beginning, at point in 516. According to one embodiment, if another interrupt takes place at point 517, for example, the second task should be repeated from the beginning at point 518. Accordingly, as an example of starvation, a certain task executed in the reconfigurable array mode may require a longer time to execute, and in this task, when an interrupt arises several times the second task may fail to terminate.

Figure 6:
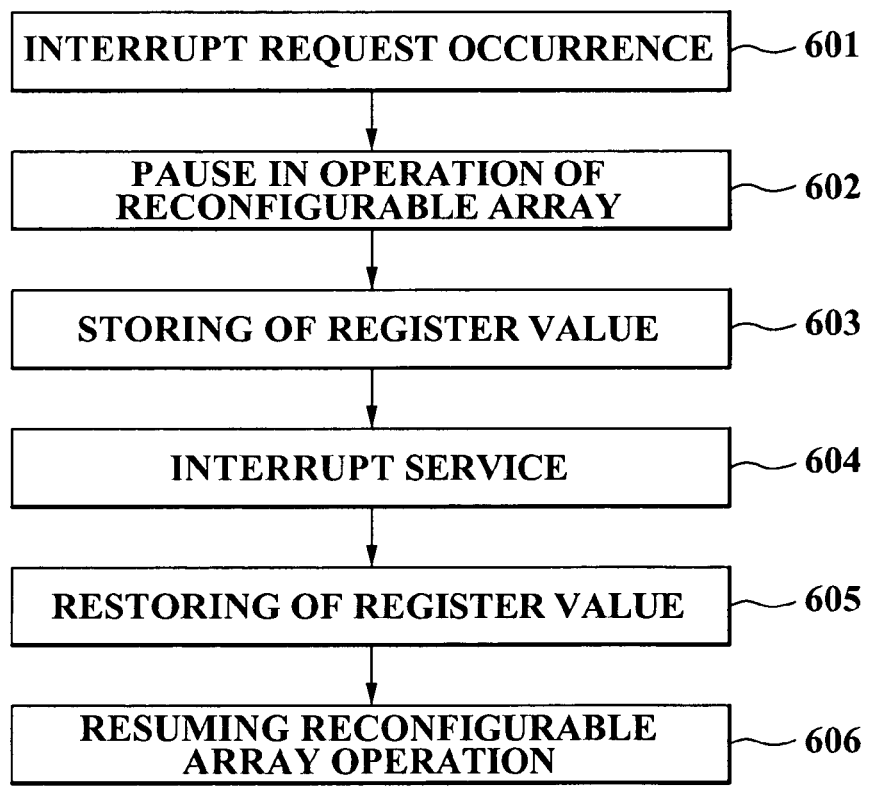
FIG. 6 illustrates a sequential process of an interrupt handling in a reconfigurable array, according to an embodiment of the present invention.

FIG. 6 illustrates a sequential process of an interrupt handling in a reconfigurable array, according to another embodiment of the present invention.

When an interrupt request happens during the operation of the reconfigurable array, in operation 601, the computing apparatus may suspend the operation of the reconfigurable array, in operation 602. Here, for suspending the operation of the reconfigurable array, stopping a clock input to the reconfigurable array may result in a pause in the operation of the reconfigurable array. Since some processing units of the CGA are used for the interrupt handling in the tightly coupled configuration, the clock should be continually supplied to such processing units, while the supply of the clock may be stopped with regard to the other processing units.

In operation 603, an interrupt handler stores register values to be used for handling of the interrupt request. As an example, a stack may be used for such storing and restoring of the register values. When a stack is used, the interrupt handler pushes the register values into the stack. That is, the register values stored only in the registers that are used in the interrupt handler, not in all registers, are pushed into the stack.

In operation 604, the interrupt handler then commences the execution of the interrupt service in response to the interrupt request.

After the interrupt service is completed, the interrupt handler restores the register values, in an operation 605. Again, only as an example, when the stack is used, the interrupt handler pops, i.e., draws, the register values from the stack. This may be referred to as a callee save, where, like here, the interrupt handler stores and restores the register values.

In operation 606, the computing apparatus may resume the operation of the reconfigurable array, e.g., by resuming the clock input to the appropriate processing elements of reconfigurable array, the operation of the reconfigurable array is resumed. That is, the task executed in the reconfigurable array may start from the suspended point.

As described above, according to this embodiment the reconfigurable array is frozen at the occurrence of an interruption, the interrupt service is executed, and the reconfigurable array is resumed after the service is finished. Therefore, the real-time handling of the interruption becomes possible, and further, the tasks of the reconfigurable array are not discarded due to such interrupt handling.

Figure 7:
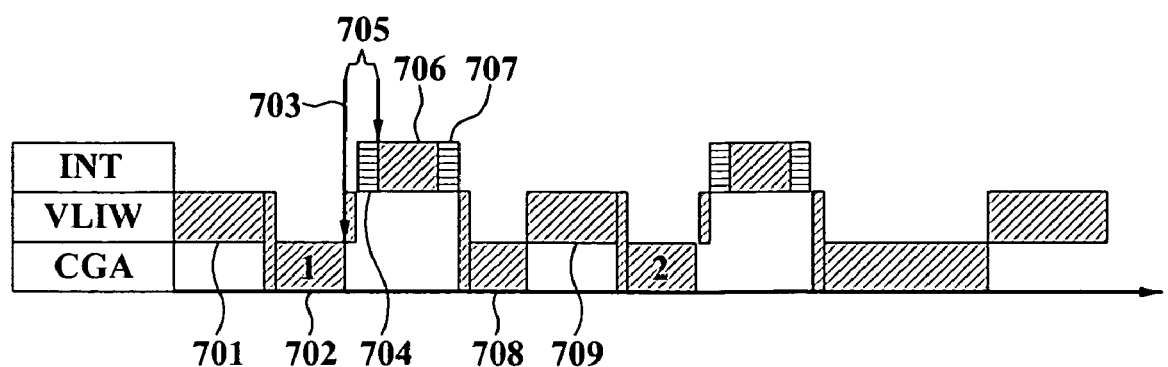
FIG. 7 illustrates an interrupt handling in a reconfigurable array, according to another embodiment of the present invention.

FIG. 7 illustrates an interrupt handling in a reconfigurable array, according to still another embodiment of the present invention.

Here, the computing apparatus executes a task in the instruction set processor mode at point 701, which switches to the reconfigurable array mode for the execution of the array computation at point 702. When an interrupt request is received during the execution of the array computation at point 703, the computing apparatus may suspend the operation of the reconfigurable array. The interrupt handler may then store the register values of the registers to be used for the handling of the interrupt request at point 704 and execute an interrupt service in response to the interrupt request at point 706. After the interrupt service, the register values may then be restored at point 707.

To alleviate some of the above described drawbacks, this embodiment may satisfy the real-time constraints of the interrupt request since an immediate service is provided in response to the interrupt request occurring during a task execution in the reconfigurable array. Although a certain amount of time is required for storing the register values during time 705, this time is negligible since only the register values of the registers used for the interrupt service are stored.

After the interrupt service, the computing apparatus may resume the suspended array task at point 708, which may be followed by a switching of the instruction set processor mode at point 709. Then the instruction set processor mode may be executed.

As an alternative, a separate register for the interrupt service may be configured, instead of the callee save. That is, two register sets may be included for the interrupt service and for the execution of the instruction set processor mode. Here, this embodiment may further permit operation using hardware, while the callee save may have to be implemented through a software operation.

After the interrupt service, the computing apparatus may resume the operation of the reconfigurable array. Again, as only an example, by stopping or resuming a clock input to the reconfigurable array, or select processing elements within the reconfigurable array, the computing apparatus may suspend or resume the operation of the reconfigurable array.

Figure 8:
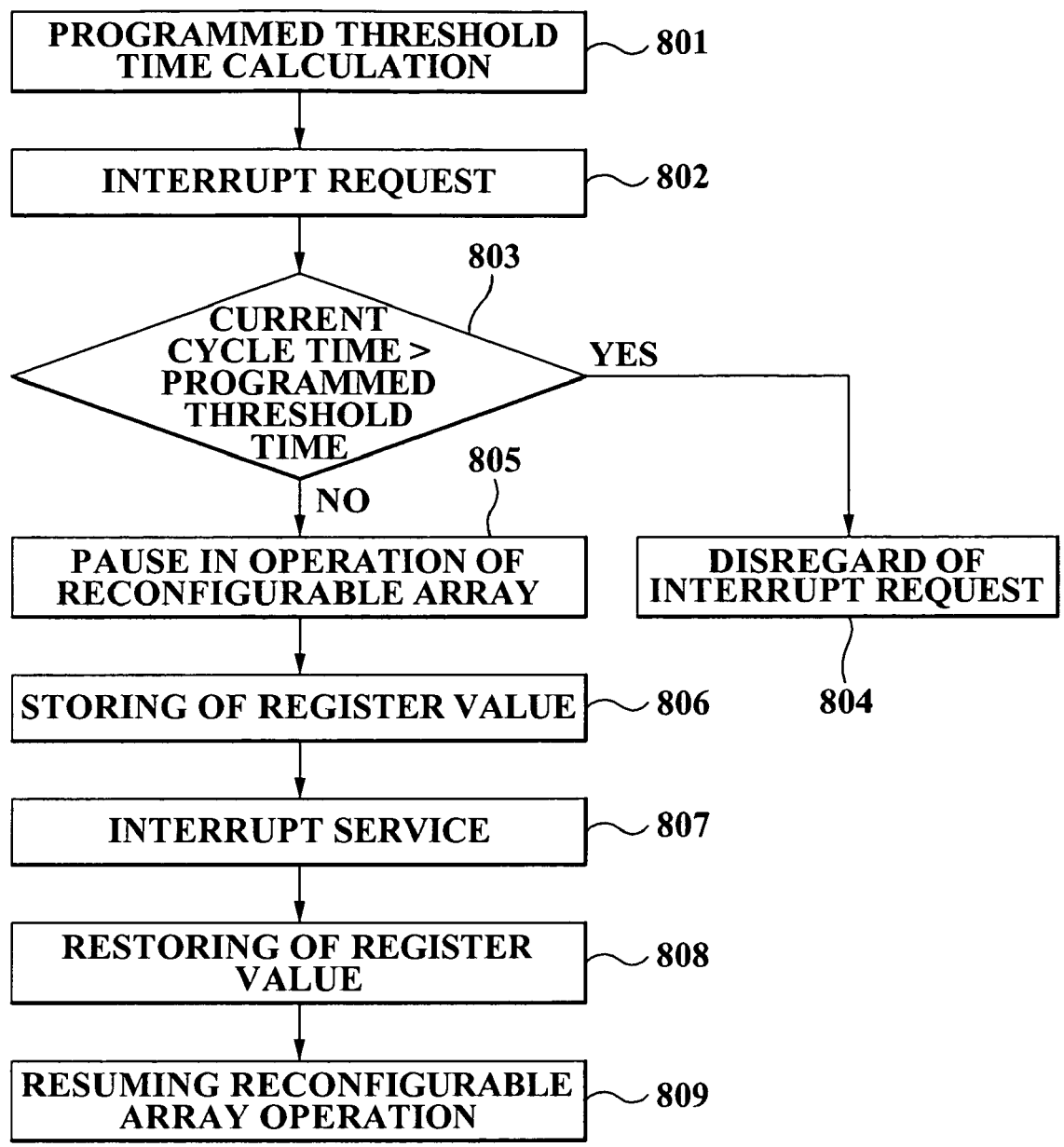
FIG. 8 is a flowchart illustrating a sequential process of an interrupt handling in a reconfigurable array according to still another exemplary embodiment of the present invention.

FIG. 8 illustrates a sequential process of an interrupt handling in a reconfigurable array, according to still another embodiment of the present invention.

At a first point 801, the computing apparatus may compute a programmed threshold time with regard to a task to be executed in the reconfigurable array. The programmed threshold time means a time limit for starting an interrupt service in response to an interrupt request occurring in the execution of the task. That is, only when the interrupt service can start within the programmed threshold time, regardless of how long the task takes when the interrupt request occurs during the execution of the array task, will the real-time constraints of the interrupt be satisfied.

As an example, a compiler may establish the programmed threshold time when an array task is assigned to the reconfigurable array. The compiler may calculate the programmed threshold time by "a starting cycle time+a worst case execution time (WCET)−a maximum interrupt latency," for example. The starting cycle time is the time it takes to start the task in the reconfigurable array. The starting cycle time may be substantially equal to the compiling time or the time when the compiler assigns the task to the reconfigurable array. As an example, the starting cycle time may use a clock cycle of the computing apparatus as a unit. The WCET is a time interval indicating when the task is expected to terminate even in the worst case while the task is executed in the reconfigurable array. The maximum interrupt latency is a maximum time allowable to postpone the start of the interrupt service in response to the interrupt request after the request occurrence.

When an interrupt request, in operation 802, occurs while a task is being executed, a programmable interrupt controller (PIC) may compare the current cycle time with the programmed threshold time, in operation 803. Here, the current cycle time is the time when the interrupt request occurs.

When the current cycle time is greater than the programmed threshold time, the PIC may disregard the interrupt request, in operation 804. In this case, even though the apparatus begins the interrupt service after waiting for a time period of "the starting cycle time+the WCET−the current cycle time", the implementation of the actual interrupt may still fall within the maximum interrupt latency. The sum of "the starting cycle time and the WCET" corresponds, even in the worst case, to the time when the array task terminates. If the current cycle time is greater than the programmed threshold time, a time from the current cycle time to the sum of "the starting cycle time and the WCET" is less than the maximum interrupt latency. Therefore, even though the interrupt request is handled after the array task terminates, such handling of the interrupt request falls within the maximum interrupt latency.

If the current cycle time is less than the programmed threshold time, the aforementioned operations 602 to 606 of FIG. 6 may be executed. That is, after the reconfigurable array pauses, in operation 805, the apparatus may store the register values of the registers to be used for the handling of the interrupt request, in operation 806, and execute the interrupt service in response to the interrupt request, operation 807. Then the apparatus restores the register values, in operation 808, and resumes the operation of the reconfigurable array, in operation 809. As discussed above, for storing or restoring the register values, a stack could be used. Further, a hardware method using two register sets may also be used.

Figure 9:
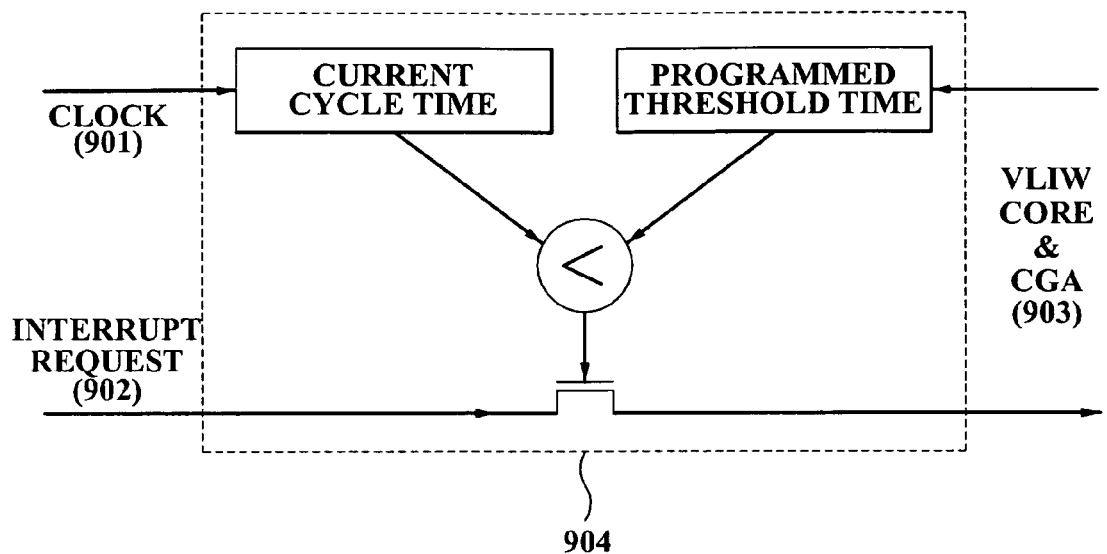
FIG. 9 illustrates a programmable interrupt controller, according to an embodiment of the present invention.

FIG. 9 illustrates a programmable interrupt controller, according to an embodiment of the present invention.

As shown in FIG. 9, in one embodiment, a PIC 904 compares a current cycle time and a programmed threshold time, and then either disregards an interrupt request 902 or transmits the interrupt request 902 to either a VLIW core or a CGA 903. The current cycle time may be obtained from a clock 901 of the computing apparatus, and the programmable threshold time may be computed by a compiler as described above, for example.

Figure 10:
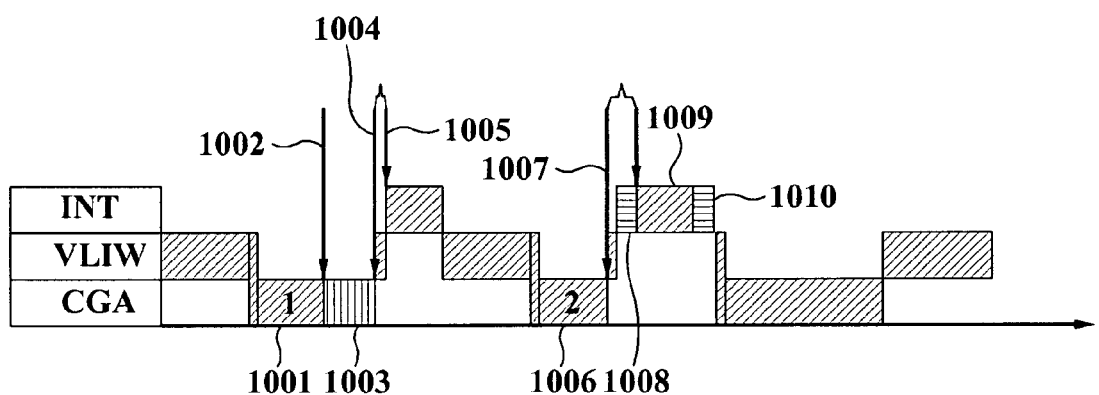
FIG. 10 illustrates an interrupt handling in a reconfigurable array, according to another embodiment of the present invention.

FIG. 10 illustrating an interrupt handling in a reconfigurable array, according to still another embodiment of the present invention.

Referring to FIG. 10, while a first array task (1) is being executed in the reconfigurable array mode at point 1001, the computing apparatus may receive a first interrupt request at point 1002. In an above embodiment, instead of immediately handling an interrupt request, an interrupt handler stores or restores values of certain registers. Conversely, in this embodiment, the comparison is executed between a current cycle time and a programmable threshold time after a receipt of the first interrupt request. Here, the current cycle time of a first array task (1) is greater than a programmable threshold time, so the first interrupt request is discarded.

After the first array task (1) has finished at point 1003, according to this example, a second interrupt request at point 1004 would not be discarded, but transferred to a processor in the instruction set processor mode. The processor in the instruction set processor mode may then execute an interrupt service in response to the second interrupt request, at point 1005. With this embodiment, the interrupt service start is delayed, but real-time constraints of the interrupt are satisfied.

Again, in the illustrated example, while a second array task (2) is being executed at point 1006, a third interrupt request may occur at point 1007. In this case, the current cycle time is smaller than the programmable threshold time, so the PIC does not discard the third interrupt request, but transmits it to a processor in the instruction set processor mode. The reconfigurable array may, thus, pause in operation. The interrupt handler not only stores the register values to be used for handling of the third interrupt request at point 1008, but also executes an interrupt service in response to the third interrupt request at point 1009. Then, the register values may be restored at point 1010, and the operation of the reconfigurable array resumed.

Figure 11:
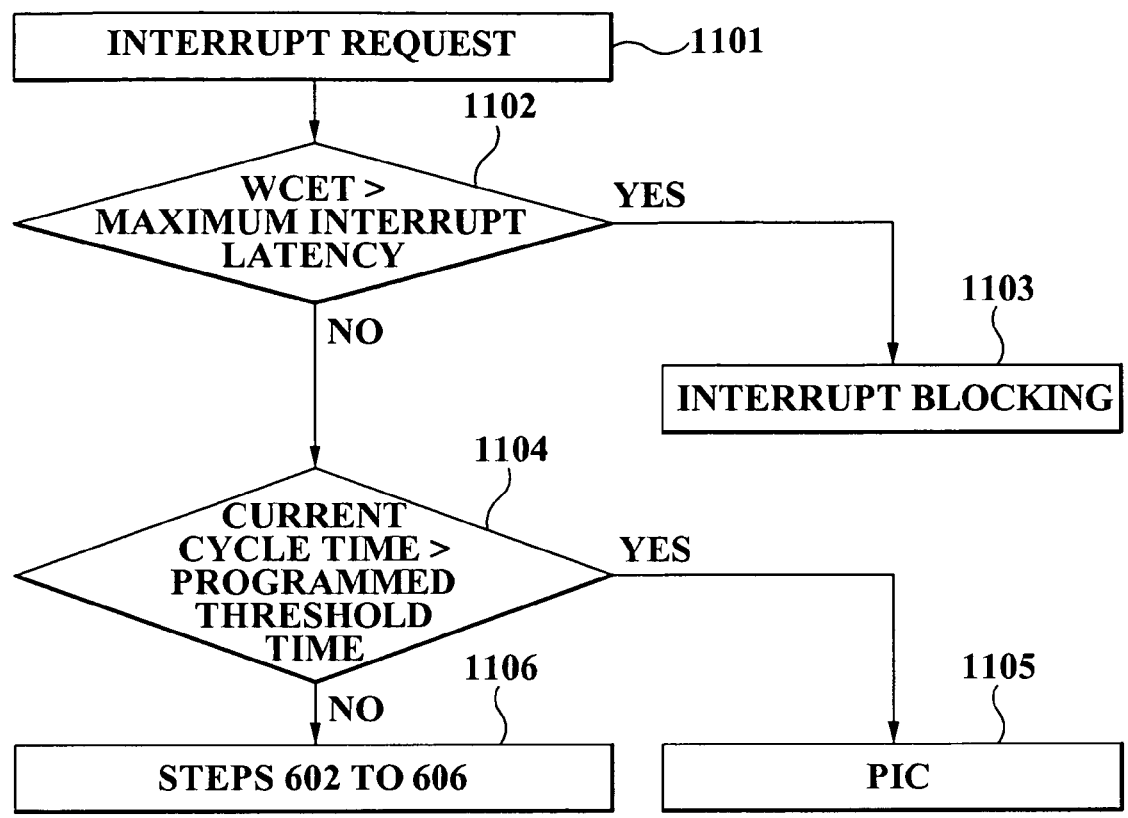
FIG. 11 illustrates a sequential process of an interrupt handling in a reconfigurable array, according to another embodiment of the present invention.

FIG. 11 illustrates a sequential process of an interrupt handling in a reconfigurable array, according to still another embodiment of the present invention.

Referring to FIG. 11, while a task is being executed in the reconfigurable array, an interrupt request may occur, in operation 1101.

Once the interrupt request occurs, the computing apparatus may compare the WCET of the task with the maximum interrupt latency of the interrupt request, in operation 1102. Again, the WCET is a time interval indicating when the task is expected to terminate, even in the worst case scenario, while the task is being executed in the reconfigurable array. The maximum interrupt latency is the maximum time allowable to postpone the start of the interrupt service in response to the interrupt request after the request occurrence.

If the WCET is not greater than the maximum interrupt latency, the apparatus may block the interrupt request, in operation 1103. That is, such a blocking may include the apparatus waiting for the end of the task and then execute the interrupt service in response to the interrupt request.

If the WCET is greater than the maximum interrupt latency, the apparatus may compare the current cycle time with the programmable threshold time, operation 1104. Here, only as example, the programmed threshold time is equal to "the starting cycle time+the WCET−the maximum interrupt latency", the starting cycle time is the time to start the task in the reconfigurable array, the WCET is the time interval indicating when the task is expected to terminate even in the worst case while the task is being executed in the reconfigurable array, and the maximum interrupt latency is the maximum time allowable to postpone the start of the interrupt service in response to the interrupt request after the request occurrence.

If the current cycle time is greater than the programmed threshold time, the PIC may discard the interrupt request, in operation 1105.

If the current cycle time is less than the programmed threshold time, the aforementioned operations 602 to 606 of FIG. 6 may be executed, in operation 1106. That is, after the reconfigurable array pauses in operation, the interrupt handler may store the register values of a register to be used for the handling of the interrupt request, and execute the interrupt service in response to the interrupt request. Then the interrupt handler may restore the register values, and resume the operation of the reconfigurable array.

Figure 12:
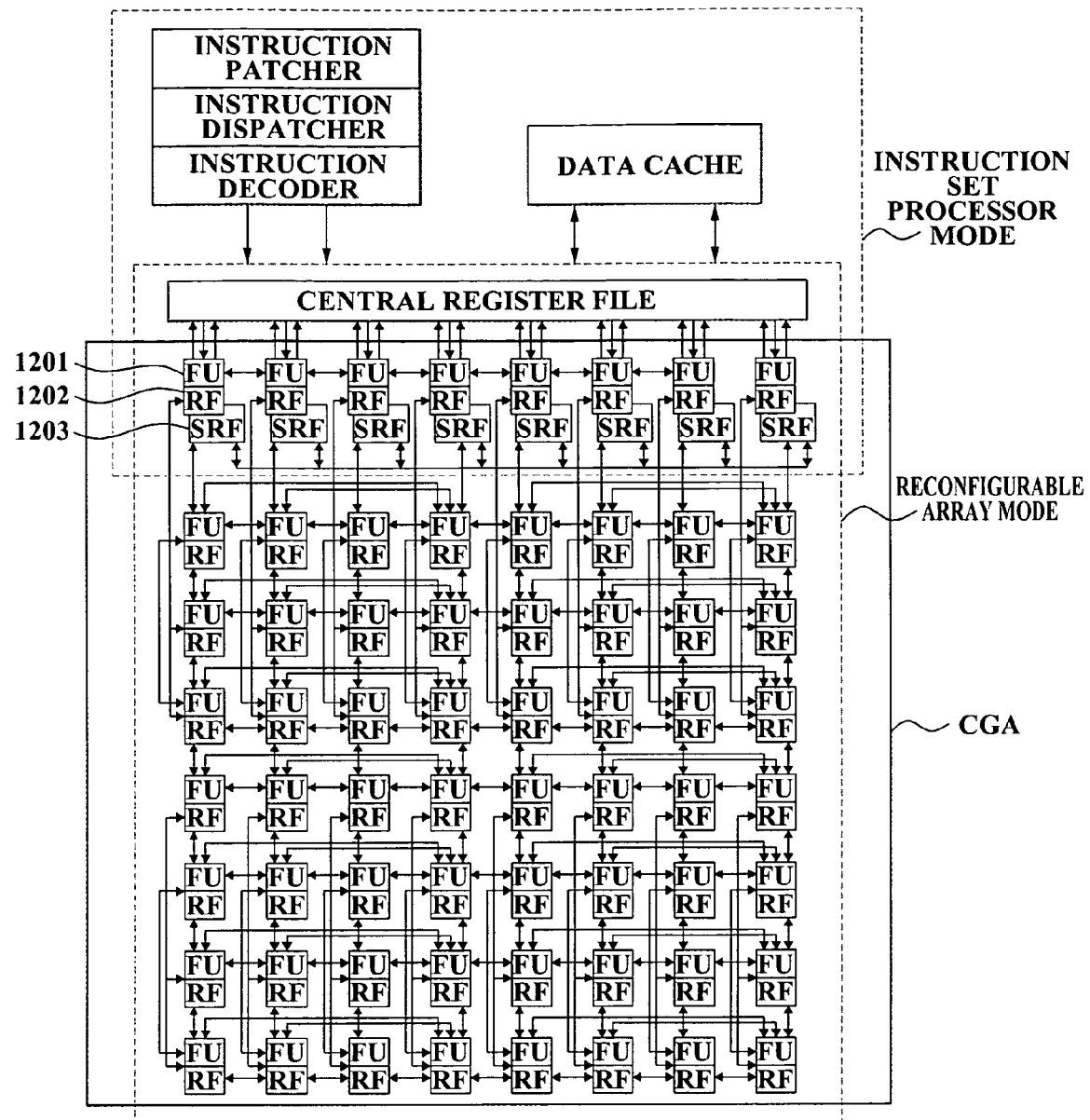
FIG. 12 illustrates an apparatus having a coarse grained array, according to another embodiment of the present invention.

FIG. 12 illustrates an apparatus having a coarse grained array, according to another embodiment of the present invention.

In this embodiment, the computing apparatus may include the reconfigurable array having processing units and shadow registers. The shadow registers 1203 correspond to selected registers 1202 among the registers used in the instruction set processor mode. The function units 1201 are also used in the instruction set processor mode.

When an interrupt occurs, the reconfigurable array operation may pause and the interrupt service may be executed using the shadow registers 1203. For the interrupt service, the function units 1201 handles the interrupt service by using a plurality of shadow registers 1203. On the other hand, the selected registers 1202 corresponding to the shadow registers 1203 are excluded from use in performing the interrupt service. When the selected registers 1202 are used, the plurality of shadow registers 1203 are not used, and when the plurality of shadow registers 1203 are used, the selected registers 1202 are not used. Only the processing elements used in interrupt handling include the shadow registers 1203. The other processing elements do not include a shadow register. Accordingly, though a size of an array of the coarse grained array becomes larger, the number of additionally needed shadow registers does not increase as much.

After the interrupt service, the computing apparatus may resume the operation of the reconfigurable array. Again, as only an example, by stopping or resuming a clock input to the reconfigurable array, or select processing elements within the reconfigurable array, the computing apparatus may suspend or resume the operation of the reconfigurable array.

In addition to the above described embodiments, embodiments of the present invention can also be implemented through computer readable code/instructions in/on a medium, e.g., a computer readable medium, to control at least one processing element to implement any above described embodiment. The medium can correspond to any medium/media permitting the storing and/or transmission of the computer readable code.

The computer readable code can be recorded/transferred on a medium in a variety of ways, with examples of the medium including magnetic storage media (e.g., ROM, floppy disks, hard disks, etc.), optical recording media (e.g., CD-ROMs, or DVDs), and storage/transmission media such as carrier waves, as well as through the Internet, for example. Here, the medium may further be a signal, such as a resultant signal or bitstream, according to embodiments of the present invention. The media may also be a distributed network, so that the computer readable code is stored/transferred and executed in a distributed fashion. Still further, as only an example, the processing element could include a processor or a computer processor, and processing elements may be distributed and/or included in a single device.

As explained above, although embodiments of the present invention may be implemented with a tightly coupled configuration of a coarse grained arrays (CGAs), embodiments of the present invention may also be favorably applied to other reconfigurable architectures with a CGA, as well as a loosely coupled configuration of a CGA.

Further, as described above, according to an aspect of an embodiment of the present invention, interrupt handling in a reconfigurable array effectively handles an interrupt, e.g., that may occur in a computing apparatus having the reconfigurable array. Particularly, even though the interrupt request occurs while a task is being executed, interrupt handling according to an embodiment of the present invention satisfies real-time constraints and minimizes overhead.

Furthermore, an embodiment of the present invention provides an interrupt handling method, medium, and apparatus that minimizes the possibility of starvation during the execution of a task in the reconfigurable array.

Additionally, an embodiment of the present invention can satisfy real-time constraints, with context storing minimized, when an interrupt request occurs during the execution of a task in a reconfigurable array.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A reconfigurable array control method, the method comprising:
computing a programmed threshold time with regard to an operation to be executed in a reconfigurable array;
comparing a current cycle time of the operation with the programmed threshold time when an interrupt request occurs during execution of the operation by the reconfigurable array;
discarding the interrupt request when the current cycle time is greater than the programmed threshold time; and
processing the interrupt request when the current cycle time is less than or equal to the programmed threshold time,
wherein the processing the interrupt request comprises:
suspending an operation of processing units other than select processing units of the reconfigurable array;
storing register values of at least one register for the select processing units of the reconfigurable array to be used for handling the interrupt request;
executing an interrupt service with the select processing units in response to the interrupt request;
restoring the register values of the at least one register for the select processing units; and
resuming the operation of the processing units other than the select processing units of the reconfigurable array after restoring the register values of the at least one register.

2. The method of claim 1, wherein the suspending of the operation includes stopping a clock of the processing units other than the select processing units of the reconfigurable array, and wherein the resuming of the operation includes resuming the clock of the processing units other than the select processing units of the reconfigurable array.

3. The method of claim 1, wherein the storing of the register values includes pushing the register values into a predetermined stack, and wherein the restoring of the register values includes popping the register values from the stack.

4. A reconfigurable array control method, the method comprising:
computing a programmed threshold time with regard to an operation to be executed in a reconfigurable array;
comparing a current cycle time of the operation with the programmed threshold time when an interrupt request occurs during execution of the operation by the reconfigurable array;
discarding the interrupt request when the current cycle time is greater than the programmed threshold time; and
processing the interrupt request when the current cycle time is less than or equal to the programmed threshold time,
wherein the processing the interrupt request comprises:
suspending an operation of processing units other than select processing units of the reconfigurable array;
executing an interrupt service with the select processing units in response to the interrupt request by using a dedicated register for the interrupt service; and
resuming the operation of the processing units other than the select processing units of the reconfigurable array after completing the interrupt service in the select processing units.

5. The method of claim 4, wherein the suspending of the operation includes stopping a clock of the processing units other than the select processing units of reconfigurable array, and wherein the resuming of the operation includes resuming the clock of the processing units other than the select processing units of the reconfigurable array.

6. A reconfigurable array control method, the method comprising:
storing a context for an instruction set processor mode before converting the instruction set processor mode into a reconfigurable array mode, with the instruction set processor mode including select processing units, of plural processing units of a reconfigurable array, used in the instruction set processor mode that are also used the reconfigurable array mode;
computing a programmed threshold time with regard to an operation to be executed in the reconfigurable array;

comparing a current cycle time of the operation with the programmed threshold time when an interrupt request occurs during execution of the operation by the reconfigurable array;

discarding the interrupt request when the current cycle time is greater than the programmed threshold time; and processing the interrupt request when the current cycle time is less than or equal to the programmed threshold time, wherein the processing the interrupt request comprises:

executing an interrupt service in the select processing units of the reconfigurable array in response to an interrupt request;

restoring the context for the instruction set processor mode after completion of the interrupt service by the select processing units; and executing, after the restoring of the context for the instruction set processor mode, the operation by the reconfigurable array from a beginning of the reconfigurable array mode.

7. The method of claim 6, wherein the interrupt service is executed by the select processing units in the instruction set processor mode.

8. At least one non-transitory computing device comprising a reconfigurable array unit and a controller unit, the controller unit to implement handling an interrupt according to the method of claim 1.

9. At least one non-transitory computing device comprising a reconfigurable array unit and a controller unit, the controller unit to implement handling an interrupt according to the method of claim 4.

10. At least one non-transitory computing device comprising a reconfigurable array unit and a controller unit, the controller unit to implement handling an interrupt according to the method of claim 6.

11. A non-transitory computing device apparatus, comprising:

a reconfigurable array comprising a plurality of processing units; and an interrupt controller to compute a programmed threshold time with regard to an operation to be executed in the reconfigurable array, to compare a current cycle time of the operation with the programmed threshold time when an interrupt request occurs during execution of the operation by the reconfigurable array, wherein the interrupt controller discards the interrupt request when the current cycle time is greater than the programmed threshold time and processes the interrupt request when the current cycle time is less than or equal to the programmed threshold time, wherein the interrupt controller stores register values of at least one register for select processing units of the reconfigurable array to be used for handling an interrupt request, executes an interrupt service by the select processing units in response to the interrupt request, and restores the register values to the at least one register upon completion of the interrupt service by the select processing units, wherein the reconfigurable array selectively suspends execution of an operation of processing units other than the select processing units of the reconfigurable array, the operation being executed by the reconfigurable array upon receipt of the interrupt request, and selectively resumes executing the operation of the processing units other than the select processing units of the reconfigurable array upon completion of the interrupt service.

12. The apparatus of claim 11, wherein the execution of the operation by the reconfigurable array is suspended by stopping a clock of the processing units other than the select processing units of the reconfigurable array, and resumes execution of the operation by resuming the clock of the processing units other than the select processing units of the reconfigurable array.

13. The apparatus of claim 12, wherein the stopping of the clock includes stopping a clock input to the reconfigurable array and the resuming of the clock includes resuming a clock input to the reconfigurable array.

14. The apparatus of claim 11, wherein at least one of the select processing units does not include a matched register file, while the plurality of processing units other than the select processing units include a respective register file matched to each processing unit.

15. At least one non-transitory computer readable medium comprising computer readable code to control at least one processing device to implement the method of claim 1.

16. At least one non-transitory computer readable medium comprising computer readable code to control at least one processing device to implement the method of claim 4.

17. At least one non-transitory computer readable medium comprising computer readable code to control at least one processing device to implement the method of claim 6.

* * * * *

UNITED STATES PATENT AND TRADEMARK OFFICE
CERTIFICATE OF CORRECTION

| | | |
|---|---|---|
| PATENT NO. | : 7,836,291 B2 | Page 1 of 1 |
| APPLICATION NO. | : 11/581366 | |
| DATED | : November 16, 2010 | |
| INVENTOR(S) | : Keun Soo Yim et al. | |

It is certified that error appears in the above-identified patent and that said Letters Patent is hereby corrected as shown below:

On the Title Page

Item (75) (Inventors), Line 2 delete "Seognam-si" and insert -- Seongnam-si --, therefor.

Item (75) (Inventors), Line 3 delete "Cheonam-si" and insert -- Cheonan-si --, therefor.

Signed and Sealed this
Eighth Day of February, 2011

David J. Kappos
*Director of the United States Patent and Trademark Office*